United States Patent
Meerholz et al.

(10) Patent No.: US 8,367,458 B2
(45) Date of Patent: Feb. 5, 2013

(54) METHOD FOR PRODUCTION OF AN ORGANIC LIGHT EMITTING DIODE OR OF AN ORGANIC SOLAR CELL AND ORGANIC LIGHT EMITTING DIODES OR SOLAR CELLS PRODUCED THEREWITH

(75) Inventors: Klaus Meerholz, Rösrath (DE); Heike Klesper, Bergisch Gladbach (DE)

(73) Assignee: Universität zu Köln, Köln (DE)

( * ) Notice: Subject to any disclaimer, the term of this patent is extended or adjusted under 35 U.S.C. 154(b) by 174 days.

(21) Appl. No.: 12/680,375

(22) PCT Filed: Sep. 26, 2008

(86) PCT No.: PCT/EP2008/062908
§ 371 (c)(1),
(2), (4) Date: Mar. 26, 2010

(87) PCT Pub. No.: WO2009/043815
PCT Pub. Date: Apr. 9, 2009

(65) Prior Publication Data
US 2010/0308307 A1    Dec. 9, 2010

(30) Foreign Application Priority Data
Sep. 28, 2007  (DE) .................. 10 2007 000 791

(51) Int. Cl.
*H01L 51/56* (2006.01)
(52) U.S. Cl. ........... 438/99; 257/E21.479; 257/E51.019; 257/E51.029
(58) Field of Classification Search ........... 257/E21.479, 257/E51.019, E51.021, E51.029
See application file for complete search history.

(56) References Cited

U.S. PATENT DOCUMENTS
2004/0043138 A1*  3/2004  Jagannathan et al. .......... 427/66
2005/0231106 A1   10/2005  Tanaka et al.
2007/0221914 A1*  9/2007  Becker et al. .................. 257/40

FOREIGN PATENT DOCUMENTS
DE      10155775        6/2003
EP       1391944        2/2004
WO     2005/109539     11/2005

* cited by examiner

*Primary Examiner* — Stephen W Smoot
(74) *Attorney, Agent, or Firm* — Dilworth & Barnes, LLP.

(57) ABSTRACT

The present invention relates to a process for producing an electronic device having two contacts, an anode and a cathode being completely or partly transmissive to light, one or more organic semi-conducting layers and one or more organic buffer layers between the contacts or the cathode and anode respectively. A solution is sprayed which contains organic material for applying at least one porous layer.

16 Claims, 2 Drawing Sheets

METHOD FOR PRODUCTION OF AN ORGANIC LIGHT EMITTING DIODE OR OF AN ORGANIC SOLAR CELL AND ORGANIC LIGHT EMITTING DIODES OR SOLAR CELLS PRODUCED THEREWITH

The present invention relates to an electronic device. From WO 2005/109539 such an electronic device is known. Such an electronic device is exemplified by an optical detector, a laser diode, a field quenching device, an optical amplifier, a solar cell or an organic light emitting diode.

BACKGROUND OF THE INVENTION

An organic light emitting diode, briefly OLED (short form for the English expression "organic light emitting diode") is a luminous component made from organic semi-conducting materials. The OLED technology is intended for visual display application (e.g. television screen, PC screen) among others. Another field of application is represented by large scale space illumination as well as advertising illumination). Considering the materials available the employment of OLEDs as area light sources, flexible display and electronic paper (E-paper) will only be a matter of time.

An OLED design consists of a plurality of thin organic layers. Usually a hole transport layer (HTL) is thereby applied onto an anode (e.g. indium tin oxide, ITO) partly or completely transmissive to light, which is located on a transparent substrate such as a sheet of glass or a transparent layer of plastic material such as polyethylene terephthalate (PET). Depending on the method of production, between the anode and the hole transport layer an additional layer of PE-DOT/PSS (poly(3,4-ethylenedioxythiophene)/polystyrene sulfonate, Baytron P) is often applied which serves for lowering the injection barrier for holes and furthermore smoothens the surface. Onto the hole transport layer, a layer is applied which either contains the dye (app. 5-10%) or—rarely—completely consists of the dye (e.g. aluminum tris(8-hydroxy quinoline)=Alq3). This layer is referred to as an emitter layer (EL). In some cases an electron transport layer (ETL) is applied thereupon. Finally a cathode (consisting of a metal or an alloy having low electron exit work, e.g. calcium, aluminum, magnesium/silver alloy) is applied by vapour deposition under high vacuum. For lowering the injection barrier for electrons a very thin layer of e.g. LiF or CsF is applied by vapour deposition between cathode and ETL or emitter. For completion the electrode may be coated with silver or aluminum for protective reasons. However, the transparent layer can likewise be adjacent to the cathode. Then the cathode is partly or completely transmissive to light.

An organic solar cell (OSC) is a photovoltaically active component made from organic semi-conducting materials or a mixture of organic and inorganic semi-conducting materials. These components are prospectively considered as inexpensive alternatives for inorganic solar cell materials.

An OSC design consists of a plurality of thin organic or in part even of inorganic layers. Usually a photovoltaically active layer is thereby applied onto an electrode (e.g. indium tin oxide, ITO) partly or completely transmissive to light which is located on a transparent substrate such as for example on a sheet of glass or a transparent layer of plastic material such as polyethylene terephthalte (PET). Depending on the method of production, between the electrode and the photovoltaically active layer an additional layer of PE-DOT/PSS (poly 3,4-ethylene dioxythiophene)/polystyrene sulfonate, Baytron P) is often applied which serves for adapting energy levels between the transparent electrode and the photovoltaically active layer, and furthermore smoothens the surface. The photovoltaically active layer either is a mixture of a donor and acceptor compound, or a sequence of layers of donor and acceptor compounds. One common example of a donor compound is poly-3-hexylthiophene (P3HT); the acceptor compound is exemplified by phenyl-C61-butylic acid methyl ester (PCBM). Additional interlayers may be present. Finally an electrode consisting of a metal or an alloy having low electron exit work (e.g. calcium, aluminum, magnesium/silver alloy) is vapour deposited under high vacuum. For completion the electrode may be coated with silver or aluminum for protective reasons.

Methods of production of such electronic components are known from the references U.S. Pat. No. 7,041,608, U.S. Pat. No. 6,593,690 as well as U.S. Pat. No. 7,018,713. Therefrom, electrostatic spraying methods for application of layers are known among others. From this state of the art it will not be realized that spraying under certain circumstances may lead to practically manufacturable electronic components enabling an extremely good out-coupling efficiency.

For creation of light a voltage is applied to the electrodes. The electrons are now injected by the cathode whereas the anode provides the holes. Hole (=positive charge) and electron (=negative charge) are drifting towards each other and ideally meet in the emitter layer, and this is why this layer is also referred to as recombination layer. The electrons and holes form a bound state which is referred to as exciton. Depending on the mechanism the exciton already represents the excited state of the dye molecule, or the decay of the exciton will provide the energy for the excitement of the dye molecule. This dye exhibits various states of excitement. The excited state can return to the ground state, thereby emitting a photon (particle of light). The colour of the emitted light depends on the energy difference between excided state and ground state and may selectively be changed by variation of the dye molecules. It is the distance between the so called HOMO and LUMO which is responsible for the wavelength of light. With the inorganic semiconductor, HOMO and LUMO correspond to the valence band and conduction band.

Disadvantageously, because of internal total reflexion, the created light will exit the glass sheet predominantly laterally and only a minor part of it will exit the glass sheet or the plastic layer frontwardly. Since usually exclusively the light which is emitted frontwardly is suitable only a small part of the created light will actually be used.

In order to improve the out-coupling of usable light, according to EP 1 100 129 A2 the provision of an interlayer having a low refractive index, consisting of aerogel, which is located between the transparent substrate and the transparent electrode is proposed. It is said that the light yield may thus be doubled. However, an interlayer consisting of aerogel cannot be manufactured practically and hence this proposal has not been put into practice.

According to WO 2005/109539 A1, in order to be able to out-couple light more practically the provision of a light emitting diode of the previously mentioned type with a porous buffer layer having a low refractive index being located between the transparent electrode and a layer consisting of an organic semiconductor is proposed. The size of the pores is in the nanometer range. In order to be able to apply an organic semiconductor layer the buffer layer is said to be of closed pores. The porous buffer layer is produced either by pyrogenes which will be eliminated from the buffer layer after layer formation, or by foaming. The porous buffer layer is said to consist of a hole conducting material.

In practice it was accomplished to produce the buffer layer known from WO 2005/109539 A1, having a refractive index of 1.6 (wavelength-dependent) and thus improve the light yield. However, the improvement is minor. Buffer layers having a lower refractive index inferior to 1.6 to further increase the light yield could not be realized. Furthermore a porous buffer layer was not realized successfully either in a practice-oriented way. For example pores cannot be manufactured by foaming in a practice-oriented way since a foaming process basically results in uneven layer thicknesses. Thus, desired layer thicknesses of the buffer layer could not be manufactured consistently. The creation of porosity with the aid of pyrogenes did not result in pores having suitable pore sizes.

SUMMARY OF THE INVENTION

The object of the present invention is the realization of an electronical device of the previously mentioned type having good and usable light in-coupling and out-coupling.

In order to accomplish the object a method for production of an electronic device is provided. The electronic device comprises a cathode and an anode. Either of the electrodes is completely or partly transmissive to light. Between the two electrodes there is one or a plurality of organic semi-conducting layers and an additional organic buffer layer. The buffer layer may likewise be an organic semi-conducting layer. For application of the buffer layer in porous form a solution is sprayed on. Preferably the solution comprises a polar solvent and/or an electrically conducting additive. In addition the solution comprises a non-polar solvent and an organic material which is dissolved by the non-polar solvent. In one embodiment the solution to be sprayed on is atomized by an electrical field. If an organic material is used which readily dissolves in the polar solvent the non-polar solvent can be omitted. What is important herein in this context is the fact that the material from which the buffer layer is to be produced can efficiently be atomized.

BRIEF DESCRIPTION OF THE DRAWINGS

The present invention will be described in greater detail with reference to the accompanying drawings in which FIG. 1 schematically illustrates an organic light emitting diode.

DESCRIPTION OF THE PREFERRED EMBODIMENTS

Figure 1:
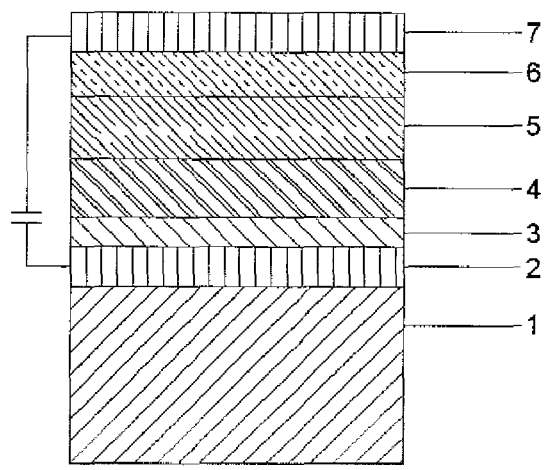

By atomizing the material from which the buffer layer will arise it will be accomplished that the desired layer thickness can be produced in a very exact and even way, that is especially in the range between 50 to 2000 nm, but always will be 200 nm of thickness, but never will exceed 1500 nm. The respective optimal layer thickness is defined by the refractive index of each layer as well as the thickness and the refractive index of all other layers present in the component. Similarly, the wavelength of the light which is to be out-coupled (OLED) and in-coupled (solar cell) from a particular layer, respectively, is of great importance for this purpose. By knowing the wavelength dependent refractive index and absorptions of all layers involved, a person skilled in the art will readily be able to calculate the optimal layer thickness and refractive index thereof which are mutually interdependent. Due to constructive and destructive interferences multiple optimal layer thicknesses will result for all refractive indices.

Before depositing the solution onto the electronical layer to be produced the solution will be charged with the organic coating material being present therein to atomize the solution. The thus obtained very fine distribution of the coating material contributes to a morphology of the buffer layer which is able to reduce the refractive index, as it has been noticed surprisingly. This in turn will result in diminishing internal losses of reflexion and in that light can be in-coupled and/or out-coupled more suitably into the electronic component. In all, the efficiency will thus be improved.

The solution to be sprayed contains solvents in which the organic material to be applied is soluble. Frequently the materials to be used are soluble in non-polar solvents. This is why the solution to be sprayed generally contains a non-polar solvent.

Non-polar solvents are to some extend poor electronic conductors. In order to nevertheless be able to electrically charge the solution sufficiently by an electric field, and thus to atomize, a polar solvent or an electrically conductive additive will be added if necessary, to accomplish the desired atomization by repulsive forces. In some cases a polar solvent is to be preferred over an additive because the organic coating material regularly is dissolved to a lesser extend in a polar solvent compared to a non-polar one. It has been noticed that this feature beneficially influences the morphology of the buffer layer such that the refractive index in the buffer layer will be lowered, resulting in an improved light in- and out-coupling.

In one embodiment the solution contains a volatile solvent, and especially chloroform, dichloromethane, acetonitrile or an alcohol, which most preferably will be ethanol or methanol. The solvents should virtually be volatile in order to be able to be removed from the layer after production of the layer, either readily at room temperature or by heating below the decomposition temperature of the organic material to be applied. It is, to some extend, advantageous if one or more of the solvents contained in the solution already vaporize following or while spraying. Hereby components can be dissolved to a lesser extend and preformed, respectively, or can be precipitated as early as during the spraying procedure or on the way of the spraying drops to the sprayed surface, thereby affecting the morphology of the developing layers. Hereby, among others, it will be controlled whether the layer components will meet the surface to be sprayed onto in a more or less dry state. The content of solvent of the spray components approximating each other will also be affected by the distance between a spray capillary employed and a surface to be sprayed onto. The content of solvent or the humidity in the atmosphere in which spraying is done will likewise affect the morphology of the developing layer.

Examples of a mixture of solvents are the following:

90% dichloromethane+10% ethanol

90% toluene+10% methanol

80% chloroform+20% ethanol

Evaporation of the solvents can also be advantageously promoted by heating. Heatable gas streams may likewise be arranged around the spray capillary to affect evaporation of the solvents. Additionally a specific adjustment of the solvent content and humidity of air in the atmosphere in which spraying is performed is of advantage. It has been noticed that the morphology of the buffer layer thus can further be improved in the sense of the present invention. The refractive index of the layer will further decrease. The desired in- and out-coupling of light will accordingly be more successful.

As nonpolar solvents tolulene, xylene, chlorobenzene, dichlorobenzene, tetrahyrdrofurane, chloroform or dichloromethane are usually suitable.

As polar solvents alcohols such as ethanol, methanol, isopropanol, acetonitrile are suitable.

As an organic coating material the groups of material disclosed in WO 2005/109539 A1 and the materials of the buffer layers known therefrom are suitable. In one embodiment low molecular weight cross linkable hole conductors are provided as an organic coating material, such as for example the structure shown below based on triarylamine with oxetane as a reactive group.

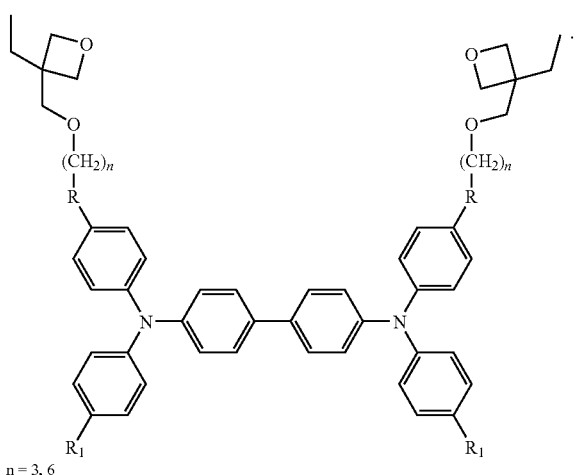

n = 3, 6
R = CH₂, CH₂O, O
R₁ = H, CH₃, OCH₃

In another embodiment of the invention low molecular weight oligomeric or polymeric hole conductor materials are provided as the organic coating material since production conditions can thus be simplified compared to the low molecular weight cross linkable hole conductors. Causative for this are the good film forming properties of oligomeric or polymeric hole conductor materials.

Examples for low molecular weight hole conductors are 4,4,4-tris(carbazole-9-yl)phenylyamine, α-NPD, spiro-TAD, TPD, MTOATA, carbazole-containing triplet matrices.

The chemical structure of oligomeric cross linkable hole conductors based on triarylamine having oxetane as a reactive group will be shown below.

The chemical structure of polymeric cross linkable hole conductors based on triarylamine having oxetane as a reactive group will be shown below.

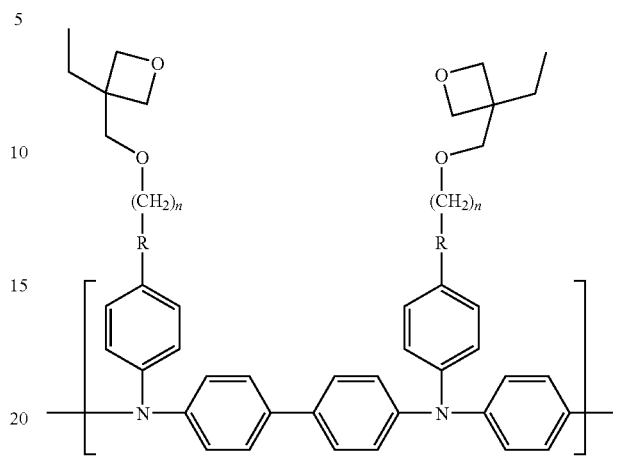

A subsequent crosslinking of porous layers thus produced will increase the mechanical strength and load-bearing capacity of the produced layer which will be of advantage for subsequent practical application.

In another embodiment an intrinsically conductive polymer such as PEDOT or polyaniline is used for the production of the buffer layer.

In another embodiment low molecular weight oligomeric and polymeric emitter materials are used for the production of the buffer layer.

Examples for this are small molecules such as for example tris(8-hydroxy-quinolinato) aluminum (Alq3), tris(2-phenyl-

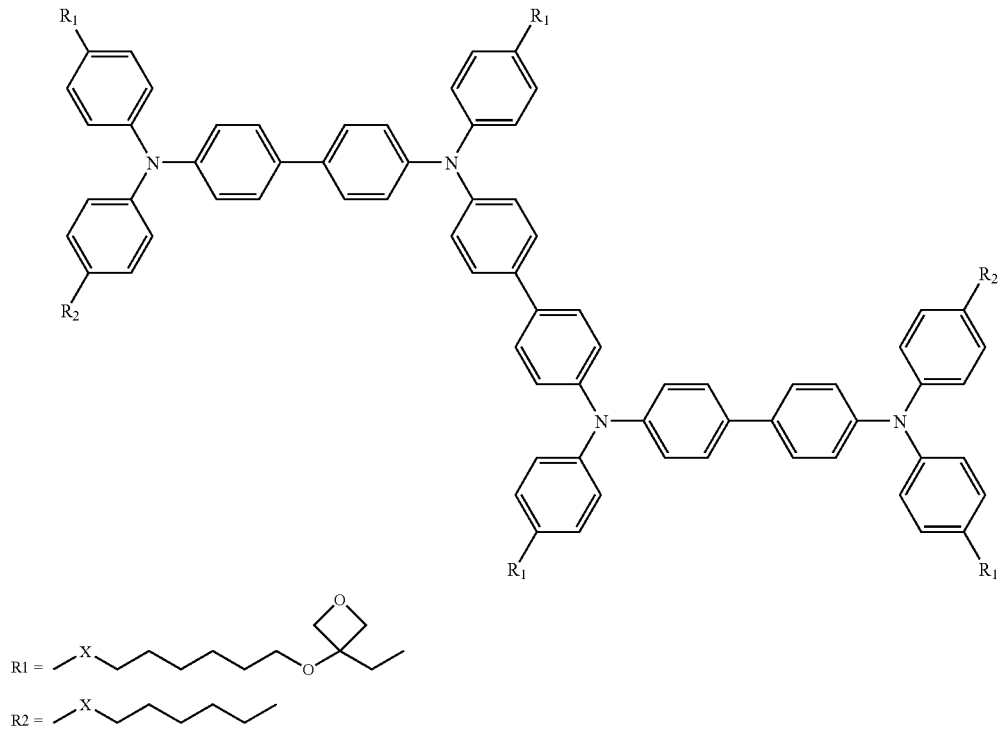

X = CH₂, O pyridiy) iridium complex, matrix carbazole+metal complex such as for example Ir(Py)$_3$, etc., oligomeric or polymeric emitters e.g. based on polyphenylene-vinylen (PPV) or based on fluorene, such as for example MEH-PPV, MDMO-PPV, Super Yellow.

In one embodiment low molecular weight oligomeric or polymeric electron transport materials are provided as organic coating material, such as 2-(biphenyl)-5-(4-tert-butyl phenyl)-1,3,4-oxadiazole, 1,3,4-oxadiazole 2,2-(1,3-phenylene)-bis(5-1-(1,1-dimethylethylphenyl), polyfluorenes, fullerenes, such as for example PCBM or PCBM multi-adducts etc.

In another embodiment photovoltaically active materials or material blends are used for production of the buffer layer. For this purpose electron acceptor materials such as fullerene derivatives or electron donor materials such as thiophene derivatives or other N- or S-heterocycles are useful.

Examples for electron acceptor materials are fullerene derivatives such as $C_{60}$, $C_{61}$-butyric acid methyl ester (PCBM), PCBM multi-adduct.

Examples for electron donor materials are poly-(3-hexyl)-thiophene (P3HT), (MDMO-PPV), dyes such as rylene dyes and merocyanine dyes, dyes which contain metal complexes.

The composition of the solution which is sprayed on for production of the buffer layer may be selected to evaporate the solvent while spraying to cause flocculation of the organic molecule and deposition in a semi-dry state. The organic material will then have solidified sufficiently in order not to deliquesce while being deposited. On the other hand the organic material is not dry enough to crumble without having achieved adhesion between individual particles. Then a morphology of the buffer layer will result which will show a lowered refractive index in relation to the compact layer and will desirably further improve the refractive index and thus the in- and out-coupling of light.

Depending on the desired morphology of the buffer layer the composition of the solution which is sprayed on for production of the buffer layer may be selected such that the solvent will not evaporate before the spraying procedure, and only the organic material already present in the drop formed will flocculate and will be deposited in a semi-dry state. Then, the organic material will be present in the form of extremely small particles when being deposited. A morphology of the buffer layer showing extremely small pores and a decreased refractive index in relation to the compact layer will result. The refractive index and thus the in- and out-coupling of light, respectively, will be improved in the aspired manner.

In one embodiment of the invention the surface onto which the coating material is to be applied is set to an electric potential which will have an attractive effect on the charged solution to be atomized, thereby reducing the losses of material caused by spraying beyond the surface.

In one embodiment of the invention the surface onto which the coating material of the buffer layer is to be applied becomes electrically charged, and oppositely to the liquid to be atomized. The electrically oppositely charged solution will thus be directed towards the surface which is to be coated with the organic material. Losses of material will thus be reduced.

In order to further minimize losses of materials in one embodiment the solution to be sprayed on becomes electrically charged and the spray cloud developing during spraying is formed by additional electrostatic and/or magnetic fields.

In another embodiment gas streams are used to form the spray cloud.

In another embodiment of the Invention the solution wherein the organic material is contained is atomized through a capillary or a nozzle. The distance between the capillary and the nozzle, respectively, and the surface to be coated will be changed during deposition procedure. At large distance rather dry organic particles will meet the surface to be coated, at small distance rather wet organic particle will meet the surface to be coated. If the first coats are applied with large distance and the subsequent coats will be applied with lower distance between the surface and capillary and nozzle, respectively, it will be accomplished that the surface of the buffer layer thus produced has a closed surface, and beneath that surface the morphology is such that the reflective index is low herein. The closed surface is of use to thereupon suitably allow application of another coat. The material of this additional coat cannot be transferred undesirably into the buffer zone impairing the properties thereof regarding refractive index or alternatively its function.

In another embodiment of the invention spraying initially is performed with low distance between nozzle and surface area. Thereafter coating will be performed with higher distance, then returning to lower distance. By doing so, first a more compact layer having extremely good adhesion and conductive attachment to the surface area to be sprayed onto is created, followed by the porous interlayer having reduced refractive index and thereupon another smooth top layer.

In another embodiment the solvent composition is initially selected to create a more compact layer having extremely good adhesion and conductive attachment to the surface area to be sprayed onto, followed by use of a composition of the solution which will produce a porous interlayer having reduced refractive index. Subsequently a smooth top layer can be created in the manner mentioned above.

In another embodiment the temperature and/or the solvent content of the atmosphere in which spraying is performed are varied to result in, in analogy to the above, layers will which have varying refractive indices. Thus for example a more compact layer initially develops in order to achieve good adhesion to the bottom layer, followed by a gradual transition into porous layers, and then another more compact top layer.

The various methods for producing compact and porous layers may be combined with each other in any desired way.

A subsequent cross linking of the layers thus produced will increase the mechanical stability and load-bearing capacity, which will be of advantage for a subsequent practical application.

In one embodiment the sprayed-on organic material is cross linked in order to stabilize the layer on the one hand and on the other hand increase the (electrical) conductivity. If a subsequent layer is applied in the form of a solution containing solvent being able to dissolve the preceding layer then cross linking is of advantage in order to prevent the buffer layer from being washed away due to lack of adhesion, or the morphology from being changed disadvantageously.

In one embodiment the sprayed-on material is doped redox-chemically in order to additionally increase its conductivity.

In one embodiment of the invention a buffer layer adjacent to the anode consists of hole conductive material. Recombination close to the anode will thus be prevented from occurring since electrons cannot penetrate into this hole transport layer. Recombination close to the anode would reduce the light yield which will be avoided by this embodiment.

In one embodiment of the invention the material of the buffer layer is selected to lower injection barriers for holes and electrons to require less energy for being able to enter the different layers. The efficiency of the electronic component will thus be improved.

Accordingly a typical embodiment for example contains one hole conductor layer (e.g. OTPD, MUPD, AUPD, QUPD or mixtures thereof) or 2 hole conductor layers each having half the thickness of the former (as "electronic steps").

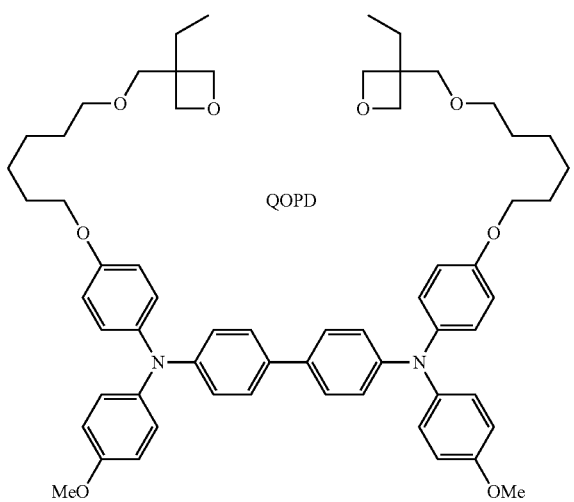

QOPD

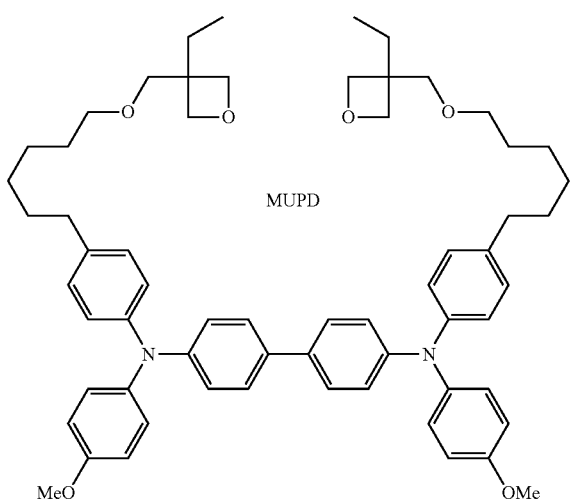

MUPD

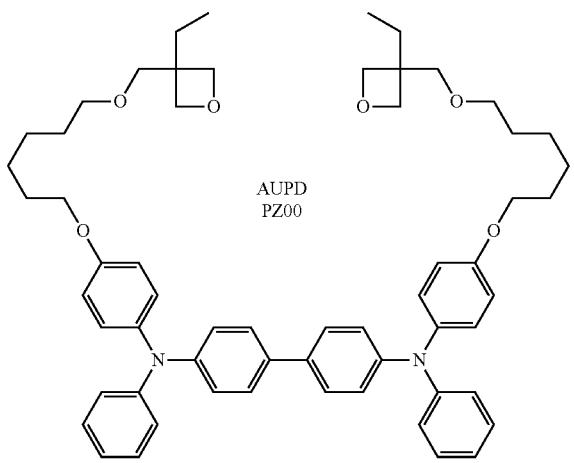

AUPD
PZ00

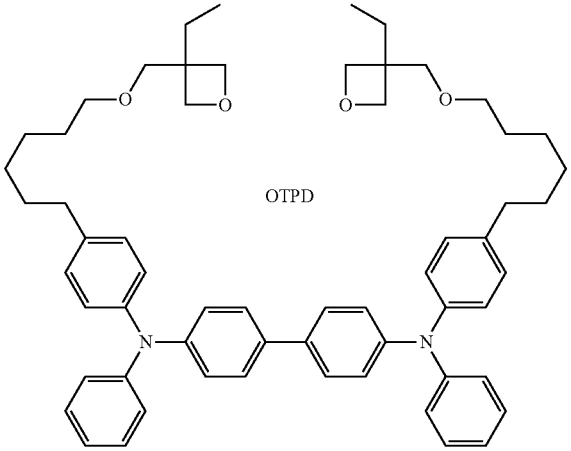 [SMILES: CCC1(COCCCCCCc2ccc(N(c3ccccc3)c3ccc(-c4ccc(N(c5ccccc5)c5ccc(CCCCCCOCC6(CC)COC6)cc5)cc4)cc3)cc2)COC1 ; "OTPD"]

OTPD

Thereupon blue-emitting polyfluorene is arranged. In one example embodiment the layer design is the following:

glass, 125 nm ITO, 30 nm PEDOT, 500 nm atomized porous hole conductor OTPD, 80 nm blue-emitting fluorene polymer, 4 nm barium, 150 nm silver. As opposed to conventional components devoid of hole conductor layers the light yield will be increased by a factor of 2-5.

An electronic component of the invention basically comprises one or more emitter layers—also referred to as recombination layers—which preferably are spatially located at the centre between both electrodes in order to thus further optimize the efficiency of the component.

In one embodiment an electron transport layer functioning in analogy to the hole transport layer is located adjacent to the cathode. In one embodiment it simultaneously is a buffer layer in the sense of the present invention, if it is provided for allowing light to enter or exit through the cathode. The light yield will thus be improved.

In one embodiment of the invention one or more emitter layers are buffer layers in the sense of the invention in order to thus improve the light yield.

In another embodiment of the invention the solution to be sprayed-on contains additives which have low refractive indices. For example, these can be compounds having the following or similar structures. In these compounds some or all H atoms may be replaced by fluorine. A higher degree of fluorination will reduce the refractive index even further. They may be cross linkable (with oxetane groups shown below) or not.

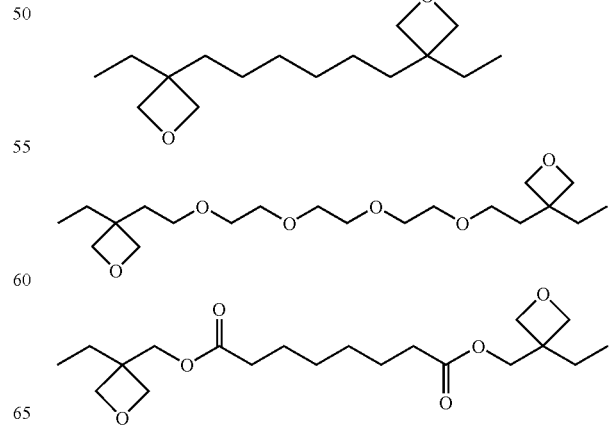

It has been noted that the desired in- and out-coupling of light may thus be further increased.

A typical example embodiment consists of a sequence of layers of glass, 125 nm ITO, 30 nm PEDOT, 500 nm sprayed porous hole conductor mixture (75% OTPD+25% fluorinated additive), 80 nm blue-emitting fluorene polymer, barium/silver. The light out-coupling will thus be increased by 10% compared to the variant mentioned above devoid of fluorinated additive.

The conductivity of the porous layers may be increased by redox-doping if required.

In one embodiment of the process the spraying procedure is performed such that the buffer layer has a rough surface.

A typical example embodiment consists of a sequence of layers of glass, 125 nm ITO, 30 nm PEDOT, 500 nm sprayed porous hole conductor (75% OTPD+25% fluorinated and occasionally cross linkable additive), 80 nm blue-emitting fluorene polymer, 4 nm barium, 150 nm silver. The roughness must have the order of magnitude of the wavelength of the emitted light (rms>20 nm) to achieve an improved out-coupling. An appropriate roughness will be obtained by setting the spraying conditions (volatility of solvents, heated gas stream to promote evaporation of the solvent, distance between spray capillary and sprayed surface) such that almost dry hole conducting material will meet the surface to be sprayed onto. Initially spraying will be performed with a low concentrated hole conductor solution so that the particles preformed from the spray drop will be as small as possible. Subsequently a higher concentration of hole conducting material in the spraying solution will be employed so that the preformed hole conducting particles meeting the surface to be sprayed onto are larger, thus generating a rougher surface. The contents of material of hole conductor+additive in the sprayed solution in the example embodiment was 4 g/l. The mixture was sprayed from a solvent mixture of 10% methanol, 80% toluene, 10% tetrahydrofurane.

This will further increase the efficiency and light yield, respectively, by a factor of 1.5 compared to the non-rough layer which was sprayed on from the very diluted solution.

In order to reach further improvement of morphology in one embodiment of the invention a gas stream is employed which, during spraying, envelops the solution to be sprayed-on, and this especially in the manner known from DE 101 55 775 A1 with the device known therefrom. This will further improve achievement of an especially suitable morphology of the buffer layer to thus increase the light yield in the desired way.

In another embodiment of the invention heatable gas streams arranged around a capillary which is used for atomization are employed to desirably enhance the morphology of the buffer layer, thus improving the light yield. Advantageously as heatable gas streams gases are used which prevent corona discharges from occurring, or at least will not promote them. Gases such as air, $N_2$, $CO_2$, $SF_6$ or mixtures thereof may be used.

In one embodiment of the invention the electronic component comprises a plurality of organic layers which in total, that is summarized, amount app. 500. It is essential that layers having thicknesses as equal as possible may be produced. Ledges and warps are to be avoided, in order to achieve an even distribution of the electrical field within the layer system. The process of the invention is able to meet these requirements despite the presence of one or more porous layers. The person skilled in the art has so far not known any approach for the realization of this object.

This is especially true for the large scale industrial coating of extensive surface substrates. Here a device is suitably provided having a plurality of spraying heads. The device/the spraying heads will then be driven over the surface to be coated and the layer will be sprayed on.

The process of the invention is able to coat extensive surfaces, even in a continuous process, by a plurality of spray nozzles which are adjustable in distance.

In the foaming process for example the mass to be foamed would have to be arranged between two platens to provide the desired smooth surface. However, the separation of the platens which subsequently will be necessary causes problems. This is not acceptable for a large scale industrial process.

The claimed process may be implemented into the existing production systems. Ideally this "finishing" of the ITO discs is performed by an intermediate step. No extensive rearrangement will be required.

Moreover the claimed process offers the possibility to initially spray-on a porous layer and thereafter modify the parameters to decrease porosity. Herein, other material (e.g. having different exit work) may also be additionally sprayed-on to obtain graduation of exit work ("electronic steps") in the hole conductor layer, besides graduation of porosity. Thus a smooth closed or almost closed surface will be provided, onto which a subsequent layer may be coated without causing penetration of said subsequent layer into the pores. Similarly a slow transition from hole conductor material to emitter material may also be created.

With solar cells, pure donor material may initially be applied analogously, wherein more acceptor material being added subsequently in the course of the layer build-up, followed by reduction of the portion of donor material. The layer sequence of electrode, donor, donor/acceptor mixture, acceptor, electrode will result. The efficiency of the solar cell may thus be increased.

The features already known in the art and cited above, single or in combination with each other, may basically be features of the present invention.

FIG. 1 schematically shows the design of an organic light emitting diode having a glass sheet 1 which serves as a substrate. Onto the substrate a transparent anode 2 consisting of indium-tin-oxide is coated. Thereupon a PEDOT layer 3 will frequently be located. Thereupon a hole-conducting layer 4 which is coated according to the example described above will be located. Above the hole-conducting layer 4 an emitter layer and a recombination layer 5, respectively, is applied. On top of the emitter layer an electron-conducting layer 6 sometimes will be located, and thereupon a cathode 7 will be located.

The ITO layer has for example a layer thickness of 140 nm and will be applied by sputtering. These discs are commercially available as "Displayglas". The PEDOT layer which is located thereupon, having a layer thickness of app. 10-200 nm, may be spin coated from the solution or else be applied in the sense of the present invention as a porous layer. The PEDOT layer may also be omitted. Thereupon the hole conductor layer, the emitter layer and occasionally the electron transport layer will be applied. One, both or all layers may be coated by spray coating and thus may be coated to have a refractive index which is reduced in comparison to the analogous compact layer. The respective optimal layer thickness for each of these layers will result from the refractive index of the coated layer which in turn will be defined e.g. by its porosity and the contents of refractive index-reducing additives. Other factors which will influence the optimal layer thickness are the layer thicknesses and refractive indices of all other layers in the component as well as, with OLEDs, the emitting wavelength, and, with solar cells, it will be the wavelength to be absorbed, respectively.

A person skilled in the art, knowing the wavelength dependent refractive indices and absorptions of all layers involved, will readily be able to calculate the optimal layer thicknesses thereof, which are mutually interdependent. Due to constructive and destructive interferences for all refractive indices several optimal layer thicknesses will result.

For the layer sequence of glass, 135 nm ITO, 35 nm PEDOT (spin coated), hole conductor QUPD, 50 nm green emitting polymer having a refractive index of n=1.8 (compact layer, spin coated), cathode Ba/Ag, layer thicknesses of 50 nm and 107 nm of a sprayed QUPD layer having a refractive index of 1.3 are optimal. For the layer sequence of glass, 135 nm ITO, 0 nm PEDOT, hole conductor QUPD, 90 nm green emitting polymer having a refractive index of n=1.3 (sprayed), cathode Ba/Ag, layer thicknesses of 118 nm of a sprayed QUPD layer having a refractive index of 1.3 are optimal. Depending on the marginal conditions of the layer system the optimal layer thicknesses of the sprayed-on layers are between 1-1000 nm. Besides the layer thickness which is optimal for the out-coupling due to the refractive index, it has to be taken into consideration that layers must also be manufacturable on a large scale technical basis.

The hole conductor layer may consist of different materials (having graduated exit work) and/or may be varyingly porous.

On top of the hole conductor layer an emitter layer having typical layer thicknesses of 20-800 nm (depending on the marginal conditions of layer sequence) is located which in turn may as well be sprayed on or spin coated or thermally vapour deposited.

On top of the emitter layer an electron-conducting layer having a layer thickness of 0-500 nm is located which may be spray coated or spin coated or thermally vapour deposited. Here, as in the case of the hole conductor, the spin coated layer may likewise consist of different materials (having graduated exit work) and/or may be varyingly porous in its course.

Above the emitter layer an electron-conducting layer may be provided on which the cathode is located. For example, the cathode consists of an alkaline fluoride (e.g. LiF, CsF etc.) of 0-10 nm coated with a non-noble metal (e.g. Ca) of 0-150 nm. Thereupon a protective metal (e.g. Ag, Al) of 0-150 nm is located. As a protective layer on top of the cathode a printable electrode may also be used. The cathode and the protective layer may be applied by thermal evaporation, sputtering, electron beam evaporation or printing.

Alternatively the sequence of layers may also be inverted (cathode on substrate, transparent anode on top).

As mentioned above, it applies to all transmissive layers that the respective optimal layer thickness for each of these layers will result from the refractive index of the coated layer, the latter in turn being defined for example by the chemical structure, its porosity and the contents of refractive index-reducing additives. Other factors influencing the optimal layer thickness will be the layer thicknesses and refractive indices of all other layers in the component as well as the emitting wavelength, with OLEDs, and with solar cells it will be the wavelength to be absorbed, respectively. A person skilled in the art, knowing the wavelength dependent refractive indices and absorptions of all layers involved, will readily be able to calculate the optimal layer thickness and refractive index thereof which will be mutually interdependent. Due to constructive and destructive interferences multiple optimal layer thicknesses will result for all refractive indices.

With an OLED component of the layer sequence described below having a porous layer the light out-coupling will be improved by a factor of 2 compared to compact, i.e. conventional layers applied by spin coating and not by spray coating. Layer sequence: glass, 73 nm ITO applied by sputtering, 0 nm PEDOT, 118 nm QUPD having a refractive index of n=1.3 (spray coated), 90 nm green emitting polymer having a refractive index of n=1.3 (spray coated), cathode Ba/Ag. Any further lowering of refractive indices which in turn will require readjustment of the respective layer thicknesses will result in further improvement of the light out-coupling.

As an example parameters used for spray coating will be set forth in the following:

As the spray capillaries stainless steel capillaries of an external diameter of 260 μm and an internal diameter of 130 μm (cutting ends deburred and polished) or fused quartz capillaries (also polished at the capillary end) having polyimide jacket are used. Single spray capillaries will be used for coating of small surface areas. In the coating of larger surface areas arrays from several spray capillaries will be used which are arranged in series adjacent to each other (each 5 capillaries spaced apart by 2 cm) and mutually offset.

The distance between spray capillary/capillaries and surface area to be coated is varyingly adjustable between 2 cm and 15 cm. The voltage applied depends on the distance from the coated surface area and will typically be between 2 kV and 6 kV. Flow rates for fluid supply to the capillary are in the range of 2-10 μl/min. The concentrations employed of the coating substances are determined by how good they are soluble in the respective solvents and whether rather many very fine pores (low concentration) ore few large pores (higher concentration) will be produced.

One example for a solution is 5 g/l Alq3 in a solvent mixture of 90% chloroform, 10% ethanol. As an additive the solution contained 0.05% formic acid. The distance between spray capillary and substrate was 8 cm, the voltage applied was 5.6 kV, the flow rate was 3.5 μl/min.

Figure 2:
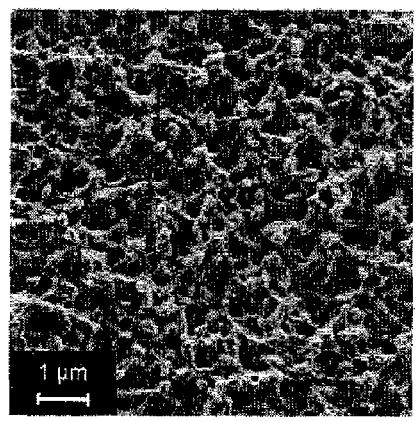
FIG. 2 illustrates an electromicroscopic view of a porous emitting layer.

FIG. 2 shows an electromicroscopic view of a porous emitter layer (AlQ3) which was produced in this way.

Figure 3:
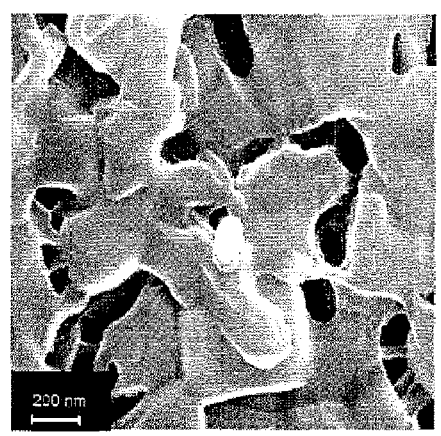
FIG. 3 illustrates an electromicroscopic view of another porous emitting layer, and FIG. 4 schematically illustrates an organic solar cell.

FIG. 3 shows another example of an electromicroscopic view of a porous PEDOT layer which was produced under the following conditions. A commercial aqueous Baytron P dispersion was diluted with ethanol in a ratio of 1:50. The distance between spray capillary and substrate was 5 cm, the voltage applied was 5.4 kV, the flow rate was 5 μl/min.

Figure 4:
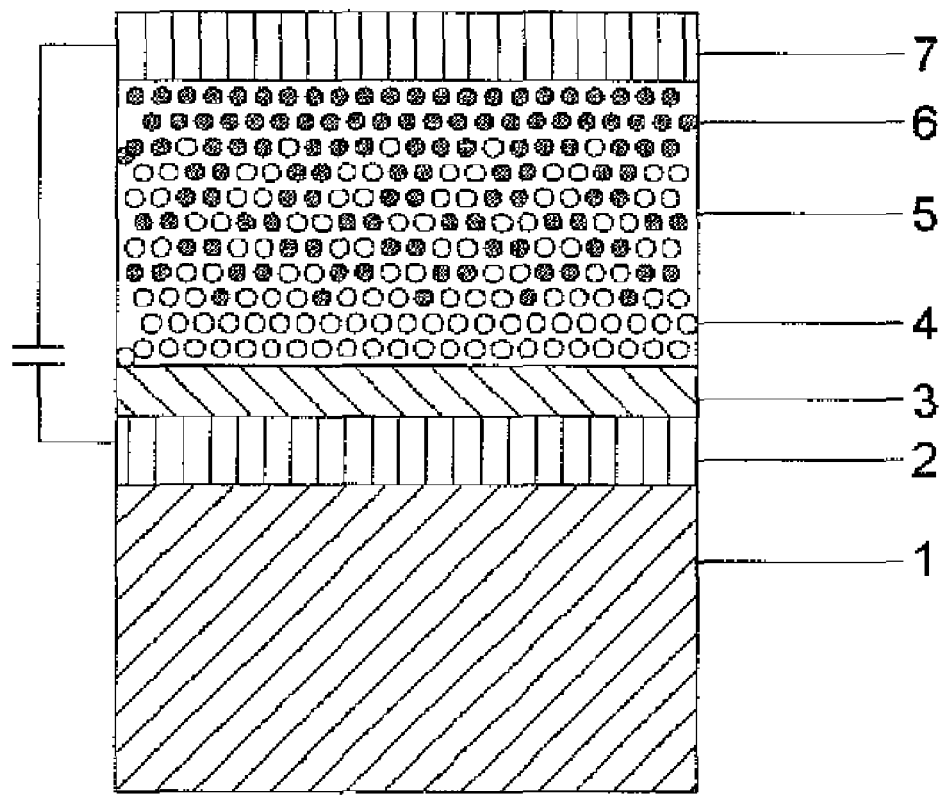

FIG. 4 shows the design of an organic solar cell having a glass sheet 1 which serves as a substrate. A transparent electrode 2 consisting of indium-tin-oxide is applied onto the substrate. Thereupon an additional PEDOT layer 3 will frequently be coated. On top of this a photovoltaically active layer sprayed-on according to the present invention which will change composition during its course (donor 4, donor acceptor mixture 5, acceptor 6) is located, and thereupon an electrode 7 is located.

The invention claimed is:

1. A process for production of an electronic device having two contacts or one anode and one cathode, one or both of them being completely or partly transmissive to light, having one or more organic semi-conducting layers and another one or more organic buffer layers between the contacts or the cathode and anode respectively, wherein
   for application of at least one porous layer a solution is sprayed on which contains organic material, and
   the solution to be sprayed on is atomized by an electrical field.

2. The process according to claim 1, wherein the solution to be sprayed on contains toluene, chlorobenzene, dichlorobenzene, xylene, chloroform, tetrahydrofurane, ethanol, methanol, isopropanol, chloroform or dichloromethane as a solvent.

3. The process according to claim 1, wherein hole conductor materials are deposited by said spraying.

4. The process according to claim 1, wherein solvent to be sprayed on contains low molecular weight polymeric or oligomeric cross linkable hole conductor materials based on triarylamine having oxetane as a reactive group, or other oxetane-cross linkable hole conductor materials as an organic material.

5. The process according to claim 1, wherein emitter materials are sprayed.

6. The process according to claim 5, wherein the emitter materials are selected from singlet emitter, triplet emitter, low molecular weight emitter, oligomeric emitter and polymeric emitter materials.

7. The process according to claim 1, wherein electron transport materials are deposited by said spraying.

8. The process according to claim 1, wherein photovoltaically active materials or material mixtures are sprayed.

9. The process according to claim 1, wherein electron acceptor materials or electron donor materials are sprayed.

10. The process according to claim 9, wherein the electron acceptor materials are fullerene derivatives and the electron donor materials are thiophene derivatives or other N- or S-heterocycles.

11. The process according to claim 1, wherein the solution to be sprayed on as well as surface area onto which the buffer solution is to be coated have an electrical potential difference.

12. The process according to claim 1, wherein the solution having the organic material contained therein is sprayed through a capillary or a nozzle and the distance between the capillary or the nozzle, respectively, and surface area to be coated of electronic component will change during layer build up.

13. The process according to claim 1, wherein in the course of the layer build up the sprayed solution will be modified, thereby depositing layers of different materials and/or different refractive indices.

14. The process according to claim 13, wherein the deposited layers have gradients.

15. The process according to claim 1, wherein materials are deposited by spraying and subsequently will be crosslinked.

16. The process according to claim 1, wherein a surface on which coating material of a buffer layer is to be applied will be electrically charged, and oppositely to fluid to be atomized.

* * * * *